US007826626B2

(12) United States Patent
Bharitkar et al.

(10) Patent No.: US 7,826,626 B2
(45) Date of Patent: Nov. 2, 2010

(54) CROSS-OVER FREQUENCY SELECTION AND OPTIMIZATION OF RESPONSE AROUND CROSS-OVER

(75) Inventors: Sunil Bharitkar, Los Angeles, CA (US); Chris Kyriakakis, Altadena, CA (US); Philip Hilmes, Culver City, CA (US); Andrew Dow Turner, Los Angeles, CA (US)

(73) Assignee: Audyssey Laboratories, Inc., Los Angeles, CA (US)

( * ) Notice: Subject to any disclaimer, the term of this patent is extended or adjusted under 35 U.S.C. 154(b) by 1427 days.

(21) Appl. No.: 11/222,001

(22) Filed: Sep. 7, 2005

(65) Prior Publication Data

US 2006/0062404 A1 Mar. 23, 2006

Related U.S. Application Data

(60) Provisional application No. 60/607,602, filed on Sep. 7, 2004.

(51) Int. Cl.
*H03G 5/00* (2006.01)

(52) U.S. Cl. ........................... 381/99; 381/103; 381/97; 381/1; 381/100; 333/132; 333/28 R; 333/177

(58) Field of Classification Search ................. 381/118, 381/56, 58, 59, 61, 103, 99; 333/132, 28 R
See application file for complete search history.

(56) References Cited

U.S. PATENT DOCUMENTS 4,109,107 A 8/1978 Boast
4,694,498 A 9/1987 Suzuki et al.
4,771,466 A 9/1988 Modafferi
4,888,809 A 12/1989 Knibbeler
5,185,801 A * 2/1993 Meyer et al. .................. 381/59
5,377,274 A 12/1994 Meyer et al.
5,572,443 A 11/1996 Emoto et al.
5,771,294 A 6/1998 Inoue et al.
5,815,580 A 9/1998 Craven et al.

(Continued)

OTHER PUBLICATIONS

B. Radlovic and R. A. Kennedy Nonminimum-Phase Equalization and its Subjective Importance in Room Acoustics IEEE Transactons on Speech and Audio Processing, vol. 8, No. 6, Nov. 2000, p. 733.*

(Continued)

*Primary Examiner*—Xu Mei
*Assistant Examiner*—Friedrich Fahnert
(74) *Attorney, Agent, or Firm*—Foley & Lardner LLP; Steven A. Moore

(57) ABSTRACT

A system and method provide at least a single stage optimization process which maximizes the flatness of the net subwoofer and satellite speaker response in and around a cross-over region. A first stage determines an optimal cross-over frequency by minimizing an objective function in a region around the cross-over frequency. Such objective function measures the variation of the magnitude response in the cross-over region. An optional second stage applies all-pass filtering to reduce incoherent addition of signals from different speakers in the cross-over region. The all-pass filters are preferably included in signal processing for the satellite speakers, and provide a frequency dependent phase adjustment to reduce incoherency between the center and left and right speakers and the subwoofer. The all-pass filters are derived using a recursive adaptive algorithm.

20 Claims, 10 Drawing Sheets

U.S. PATENT DOCUMENTS

| | | | | |
|---|---|---|---|---|
| 5,930,374 | A | 7/1999 | Werrbach et al. | |
| 6,064,770 | A | 5/2000 | Scarth et al. | |
| 6,072,877 | A | 6/2000 | Abel | |
| 6,118,875 | A | 9/2000 | Moller et al. | |
| 6,519,344 | B1 * | 2/2003 | Yajima et al. | 381/103 |
| 6,650,756 | B1 | 11/2003 | Saito et al. | |
| 6,650,776 | B2 | 11/2003 | Ihara et al. | |
| 6,721,428 | B1 * | 4/2004 | Allred et al. | 381/103 |
| 6,760,451 | B1 | 7/2004 | Craven et al. | |
| 6,792,114 | B1 | 9/2004 | Kates et al. | |
| 6,854,005 | B2 * | 2/2005 | Thiele | 708/819 |
| 6,956,955 | B1 | 10/2005 | Brungart | |
| 6,980,665 | B2 | 12/2005 | Kates | |
| 7,158,643 | B2 | 1/2007 | Lavoie et al. | |
| 2001/0038702 | A1 * | 11/2001 | Lavoie et al. | 381/307 |
| 2003/0112981 | A1 | 6/2003 | McWilliam et al. | |
| 2003/0200236 | A1 | 10/2003 | Hong | |
| 2003/0235318 | A1 | 12/2003 | Bharitkar et al. | |
| 2005/0031135 | A1 * | 2/2005 | Devantier et al. | 381/59 |
| 2005/0069153 | A1 * | 3/2005 | Hall et al. | 381/103 |
| 2005/0157891 | A1 * | 7/2005 | Johansen | 381/103 |
| 2005/0220312 | A1 | 10/2005 | Kasai et al. | |

OTHER PUBLICATIONS

Bhariktar, Sunil, A Classification Scheme For Acoustical Room Responses, IEEE, Aug. 2001, vol. 2, pp. 671-674.

Bharitkar, S., A Cluster Centroid Method for Room Respone Equilization at Multiple Locations., Applications of Signal Processing to Audio and Acoustics, Oct. 2001, pp. 55-58.

Bharitkar et al, Multiple Point Room Response Equalization Using Clustering, Apr. 24, 2001, pp. 1-24.

International Search Report dated Oct. 3, 2003 for PCT/US03/16226.

Kumin, Daniel, Snell Acoustics RSC 1000 Room-Correction System, Audio, Nov. 1997, vol. 81, No. 11, pp. 96-102.

S.J. Elliott, Multiple-Point Equalization in a Room Using Adaptive Digital Filters. Journal of Audio Engineering Society, Nov. 1989, vol. 37, pp. 899-907.

* cited by examiner

CROSS-OVER FREQUENCY SELECTION AND OPTIMIZATION OF RESPONSE AROUND CROSS-OVER

The present application claims the benefit of U.S. Provisional Application Ser. No. 60/607,602, filed Sep. 7, 2004, which application is incorporated herein by reference. The present application further incorporates by reference the related patent application for "Phase Equalization for Multi-Channel Loudspeaker-room Responses" filed on Sep. 7, 2005.

BACKGROUND OF THE INVENTION

The present invention relates to signal processing and more particularly to cross-over frequency selection and optimization for correcting the frequency response of each speaker in a speaker system to produce a desired output.

Modern sound systems have become increasingly capable and sophisticated. Such systems may be utilized for listening to music or integrated into a home theater system. One important aspect of any sound system is the speaker suite used to convert electrical signals to sound waves. An example of a modern speaker suite is a multi-channel 5.1 channel speaker system comprising six separate speakers (or electroacoustic transducers) namely: a center speaker, front left speaker, front right speaker, rear left speaker, rear right speaker, and a subwoofer speaker. The center, front left, front right, rear left, and rear right speakers (commonly referred to as satellite speakers) of such systems generally provide moderate to high frequency sound waves, and the subwoofer provides low frequency sound waves. The allocation of frequency bands to speakers for sound wave reproduction requires that the electrical signal provided to each speaker be filtered to match the desired sound wave frequency range for each speaker. Because different speakers, rooms, and listener positions may influence how each speaker is heard, accurate sound reproduction may require to adjusting or tuning the filtering for each listening environment.

Cross-over filters (also called base-management filters) are commonly used to allocate the frequency bands in speaker systems. Because each speaker is designed (or dedicated) for optimal performance over a limited range of frequencies, the cross-over filters are frequency domain splitters for filtering the signal delivered to each speaker.

Common shortcomings of known cross-over filters include an inability to achieve a net or recombined amplitude response, when measured by a microphone in a reverberant room, which is sufficiently flat or constant around the cross-over region to provide accurate sound reproduction. For example, a listener may receive sound waves from multiple speakers such as a subwoofer and satellite speakers, which are at non-coincident positions. If these sound waves are substantially out of phase (viz., substantially incoherent), the waves may to some extent cancel each other, resulting in a spectral notch in the net frequency response of the audio system. Alternatively, the complex addition of these sound waves may create large variations in the magnitude response in the net or combined subwoofer and satellite speaker response.

BRIEF SUMMARY OF THE INVENTION

The present invention addresses the above and other needs by providing a system and method which provide a least a single stage optimization process which optimizes flatness around a cross-over region. A first stage determines an optimal cross-over frequency by minimizing an objective function in a region around the cross-over frequency. Such objective function measures the variation of the magnitude response in the cross-over region. An optional second stage applies all-pass filtering to reduce incoherent addition of signals from different speakers in the cross-over region. The all-pass filters may be included in signal processing circuitry associated with either each of the satellite speaker channels or the subwoofer channel or both, and provides a frequency dependent phase adjustment to reduce incoherency between the satellite speakers and the subwoofer. The all-pass filters may be derived using a recursive adaptive algorithm or a constrained optimization algorithm. Such all-pass filters may further be used to reduce or eliminate incoherency between individual satellite speakers.

In accordance with one aspect of the invention, there is provided a method for minimizing the spectral deviations of the net subwoofer and satellite speaker response in a cross-over region. The method comprises measuring the full-range (i.e., non bass-managed or without high pass or low pass filtering) subwoofer and satellite speaker response in at least one position in a room, selecting a cross-over region, selecting a set of candidate cross-over frequencies and corresponding bass-management filters for the subwoofer and the satellite speaker, applying the corresponding bass-management filters to the subwoofer and satellite speaker full-range response, level matching the bass-managed subwoofer and satellite speaker response, performing addition of the subwoofer and satellite speaker response to obtain a net bass-managed subwoofer and satellite speaker response, computing an objective function using the net response for each of the candidate cross-over frequencies, and selecting the candidate cross-over frequencies resulting in the lowest objective function. The method may further included an additional step of all-pass filtering to further attenuate the spectral notch.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
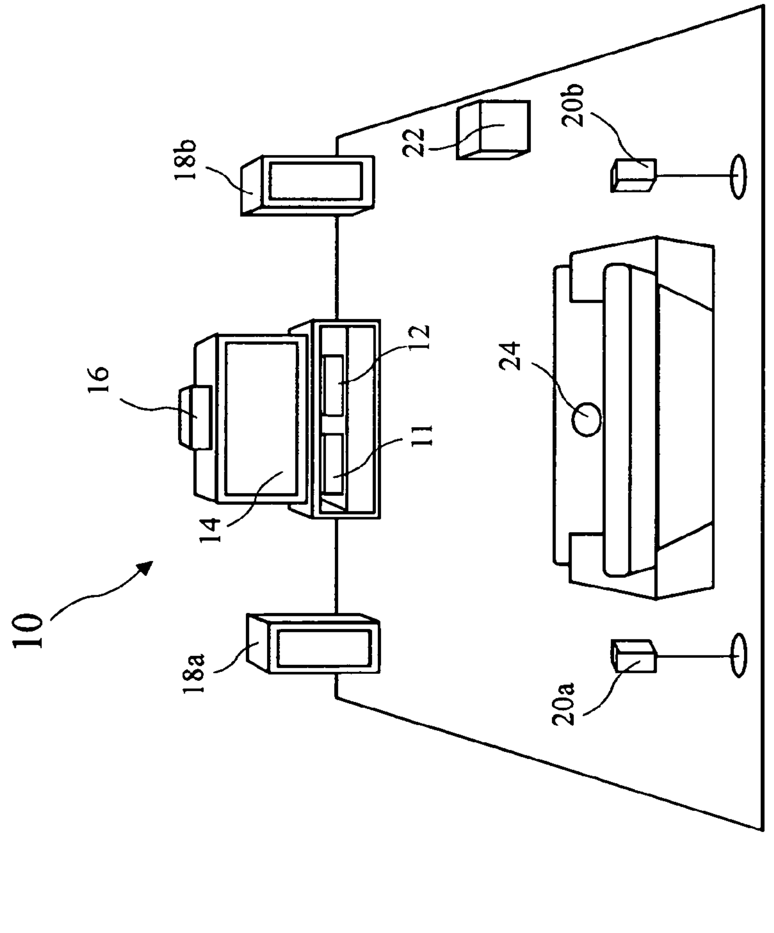
FIG. 1 is an example of a multi-channel 5.1 layout in a room.

A typical home theater 10 is shown in FIG. 1. The home theater 10 comprises a media player (for example, a DVD player) 11, a signal processor 12, a monitor (or television) 14, a center speaker 16, left and right front speakers **18*a* and 18*b* respectively, left and right rear (or surround) speakers 20*a* and 20*b* respectively, a subwoofer speaker 22, and a listening position 24. The media player 11 provides video and audio signals to the signal processor 12. The signal processor 12** in often an audio video receiver including a multiplicity of functions, for example, a tuner, a pre-amplifier, a power amplifier, and signal processing circuits (for example, a family of graphic equalizers) to condition (or color) the speaker signals to match a listener's preferences and/or room acoustics.

Figure 2:
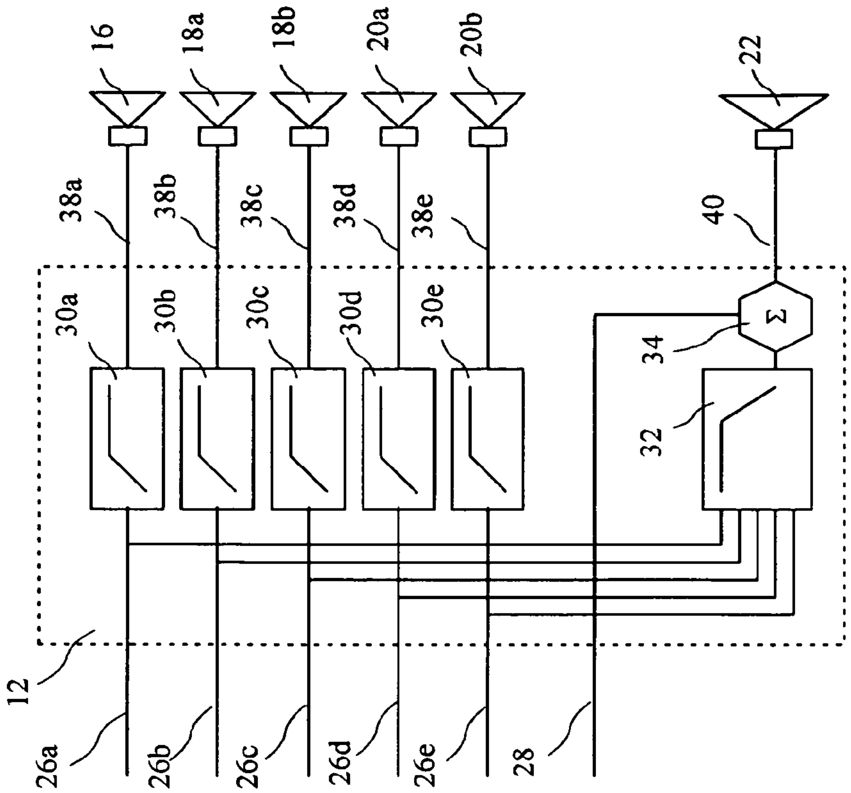
FIG. 2 (prior art)
FIG. 2 is a prior art signal processing flow for a home theater speaker suite.

Signal processors 12 used in home theater systems 10, which home theater systems 10 includes a subwoofer 22, also generally include cross-over (or bass-management) filters **30*a*-30*e* and 32 as shown in FIG. 2. The subwoofer 22 is designed to produce low frequency sound waves, and may cause distortion if it receives high frequency electrical signals. Conversely, the center, front, and rear speakers 16, 18*a*, 18*b*, 20*a*, and 20*b* are designed to produce moderate and high frequency sound waves, and may cause distortion if they receive low frequency electrical signals. To reduce the distortion, the unfiltered signals 26*a*-26*e* provided to the speakers 16, 18*a*, 18*b*, 20*a*, and 20*b* are processed through high pass filters 30*a*-30*e* to generate filtered speaker signals 38*a*-38*e*. The same unfiltered signals 26*a*-26*e* are processed by a low-pass filter 32 and summed with a subwoofer signal 28 in a summer 34 to generate a filtered subwoofer signal 40 provided to the subwoofer 22**.

Figure 3:
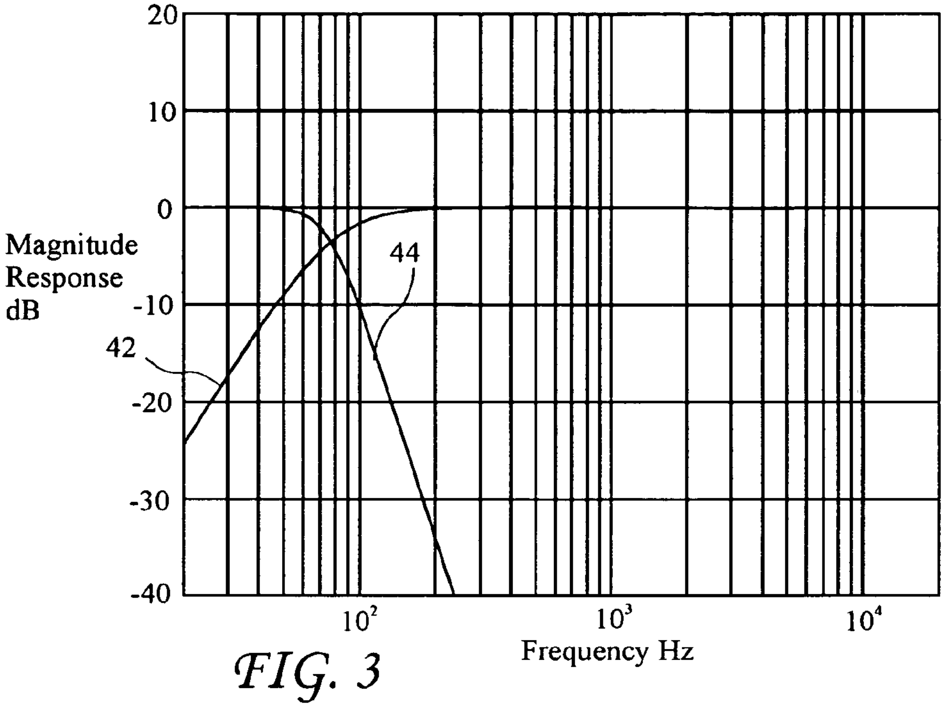
FIG. 3 shows typical magnitude responses of subwoofer and satellite speaker bass-management filters.

An example of a system including a prior art signal processor 12 as described in FIG. 2 is a THX® certified speaker system. The frequency responses of THX® bass-management filters for subwoofer and satellite speakers of such THX® certified speaker system are shown in FIG. 3. Such THX® speaker system certified signal processors are designed with a cross-over frequency (i.e., the 3 dB point) of 80 Hz and include a bass management filter 32 preferably comprising a fourth order low-pass Butterworth filter (or a dual stage filter, each stage being a second order low-pass Butterworth filter) having a roll off rate of approximately 24 dB/octave above 80 Hz (with low pass response 44), and high pass bass management filters **30*a*-30*e* comprising a second order Butterworth filter having a roll-off rate of approximately 12 DB per octave below 80 Hz (with high pass response 42**).

Figure 4A:
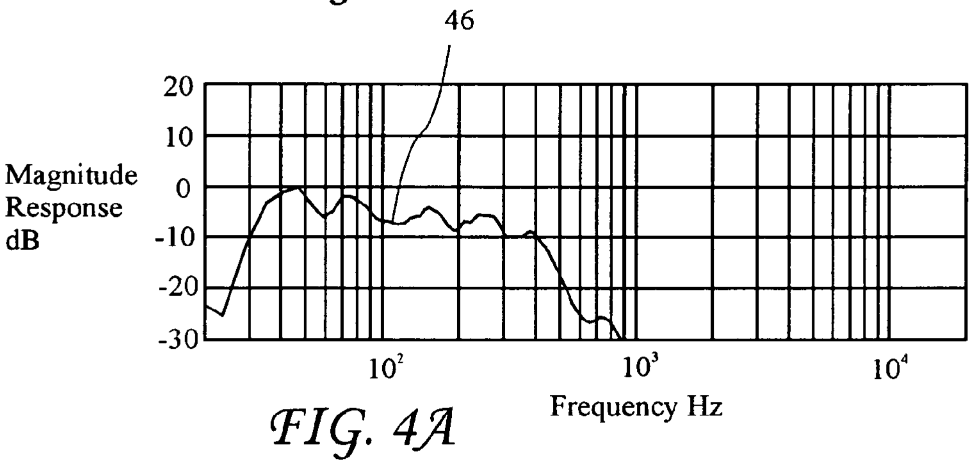
FIG. 4A is a frequency response for a subwoofer.
Figure 4B:
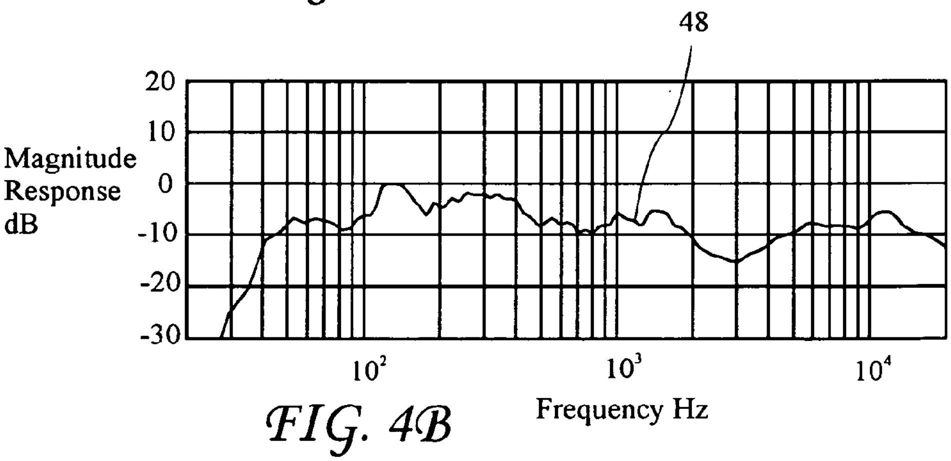
FIG. 4B is a frequency response for a satellite speaker.

While such THX® speaker system certified signal processors conform to the THX® speaker system standard, many speaker systems do not include THX® speaker system certified signal processors. Such non-THX® systems (and even THX® speaker systems) often benefit from selection of a cross-over frequency dependent upon the signal processor 12, satellite speakers 16, **18*a*, 18*b*, 20*a*, 20*b*, subwoofer speaker 22, listener position, and listener preference (in the present application, the term "satellite speaker" is applied to any non-subwoofer in the speaker system). In the instance of non-THX® speaker systems, the 24 dB/octave and 12 dB/octave filter slopes (see FIG. 3) may still be utilized to provide adequately good performance. For example, individual subwoofer 22 and non-subwoofer or satellite speaker 16, 18*a*, 18*b*, 20*a*, and 20*b* (in this example the center channel speaker 16 in FIG. 2) full-range frequency responses (one third octave smoothed), as measured in a room with reverberation time $T_{60}$ of approximately 0.75 seconds, are shown in FIGS. 4A and 4B respectively. As can be seen, the center channel speaker 16 has a center channel frequency response 48 extending below 100 Hz (down to about 40 Hz), and the subwoofer 22 has a subwoofer frequency response 46** extending up to about 200 Hz.

Figure 5:
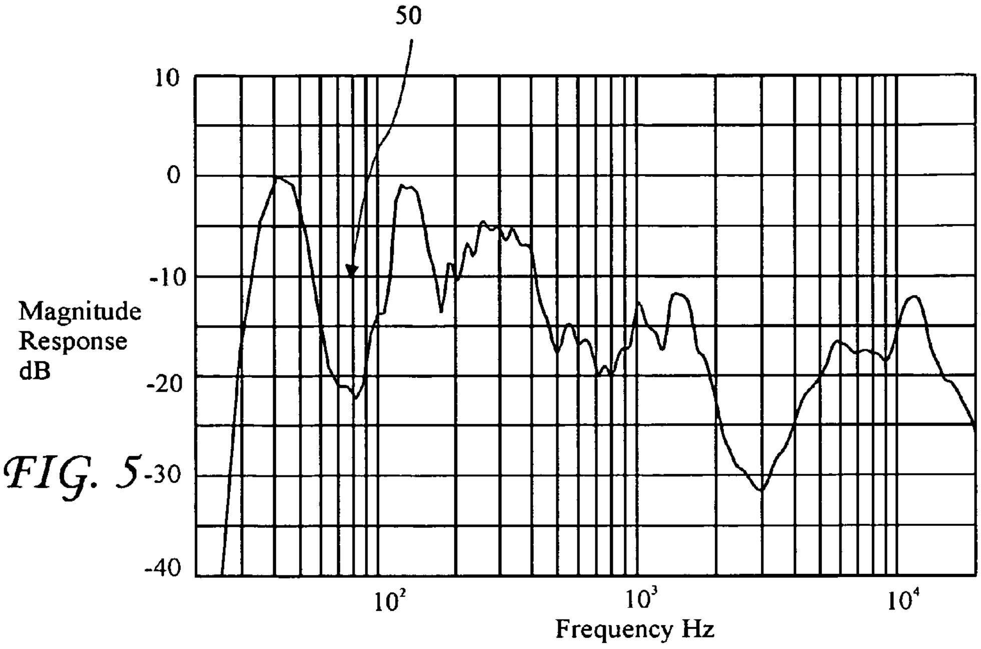
FIG. 5 is a combined subwoofer and satellite speaker magnitude response having a spectral notch for an incorrect choice of cross-over frequency

The satellite speakers 16, **18*a*, 18*b*, 20*a*, 20*b*, and subwoofer speaker 22, as shown in FIG. 1 generally reside at different positions around a room, for example, the subwoofer 22 may be at one side of the room, while the center channel speaker 16 is generally position near the monitor 14. Due to such non-coincident positions of the speakers, if the cross-over frequency is not carefully selected, sound waves near the cross-over frequency may add incoherently (i.e., at or near 180 degrees out of phase), thereby creating a spectral notch 50 and/or other substantial amplitude variations in the cross-over region shown in FIG. 5. Such spectral notch 50 and/or amplitude variations may further vary by listening position 24, and more specifically by acoustic path differences from the individual satellite speakers and subwoofer speaker to the listening position 24**.

The spectral notch 50 and/or amplitude variations in the crossover region may contribute to loss of acoustical efficiency because some of the sound around the cross-over frequency may be undesirably attenuated or amplified. For example, the spectral notch 50 may result in a significant loss of sound reproduction to as low as 40 Hz (about the lowest frequency which the center channel speaker 16 is capable of producing). Such spectral notches have been verified using real world measurements, where the subwoofer speaker 22 and satellite speakers 16, **18*a*, 18*b*, 20*a*, and 20*b*** were excited with a broadband stimuli (for example, log-chirp signal) and the net response was de-convolved from the measured signal.

Figure 6:
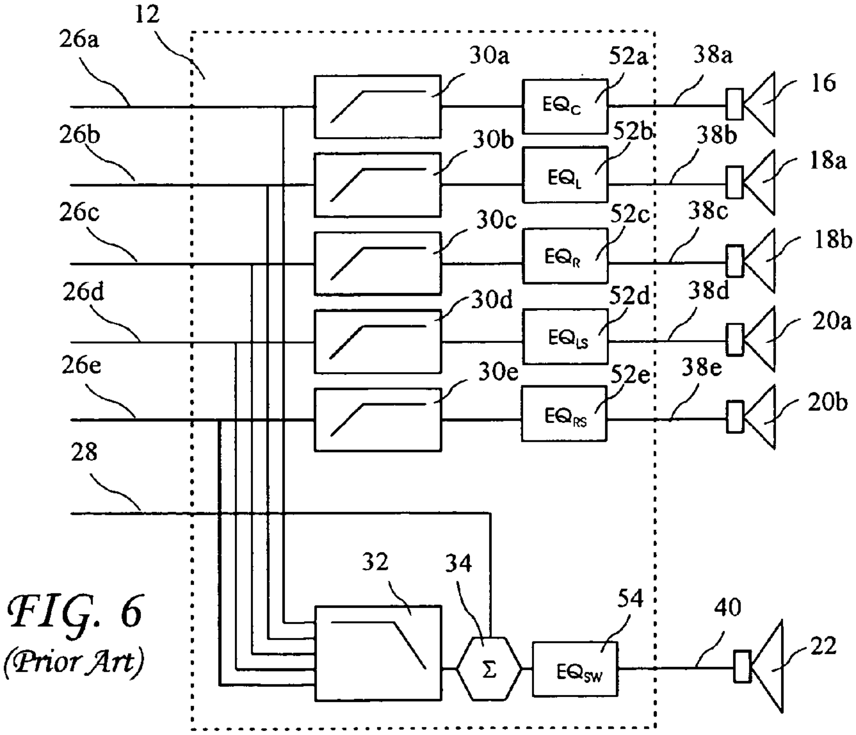
FIG. 6 (Prior Art)
FIG. 6 is a signal processing flow for a prior art signal processor including equalization filters.
Figure 7A:
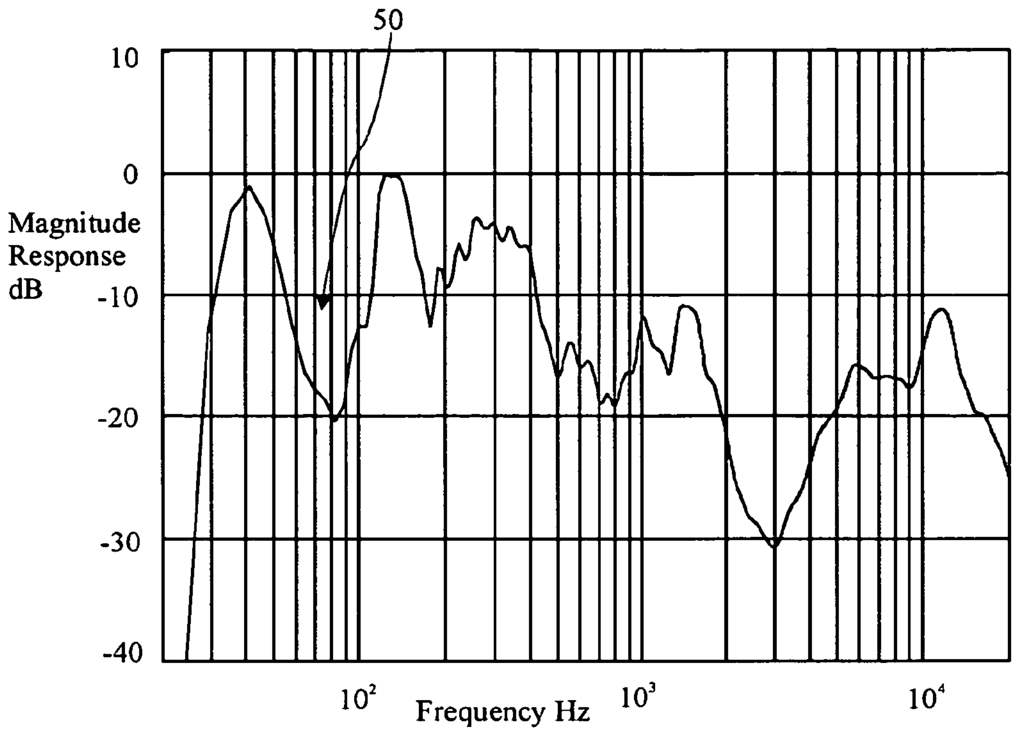
FIG. 7A is a combined satellite speaker and subwoofer magnitude response for a cross-over frequency of 30 Hz.
Figure 7B:
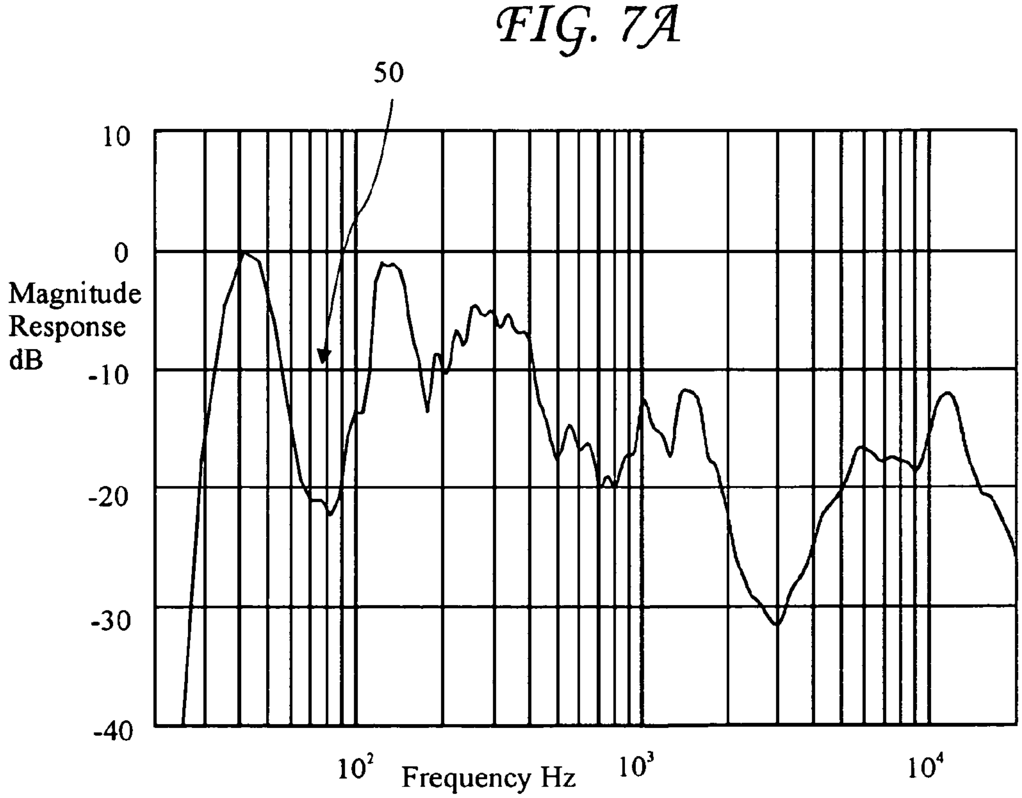
FIG. 7B is a combined satellite speaker and subwoofer magnitude response for a cross-over frequency of 40 Hz.
Figure 7C:
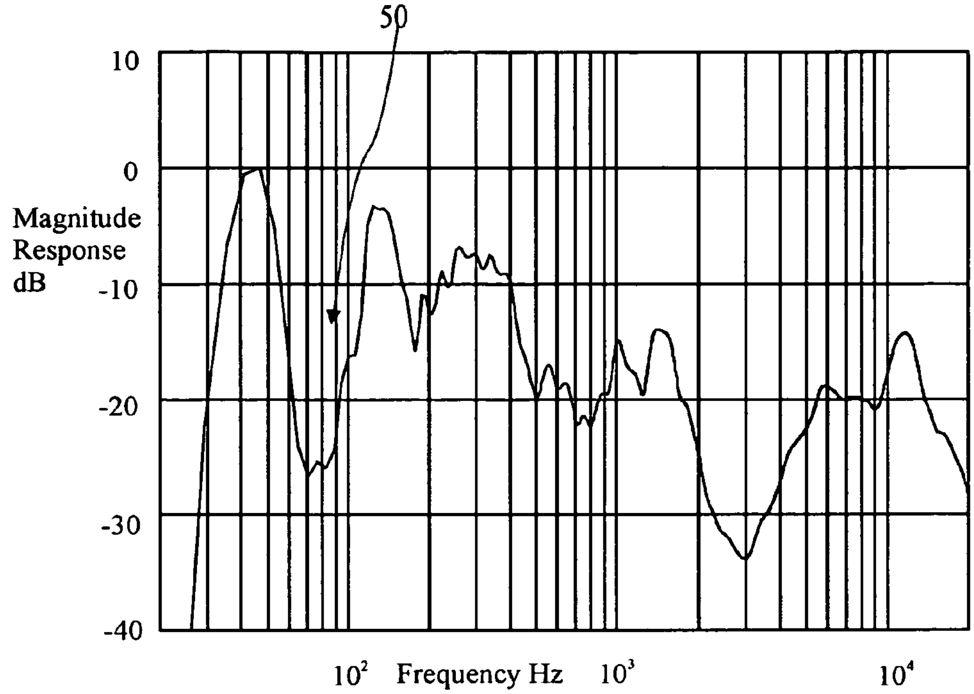
FIG. 7C is a combined satellite speaker and subwoofer magnitude response for a cross-over frequency of 50 Hz.
Figure 7D:
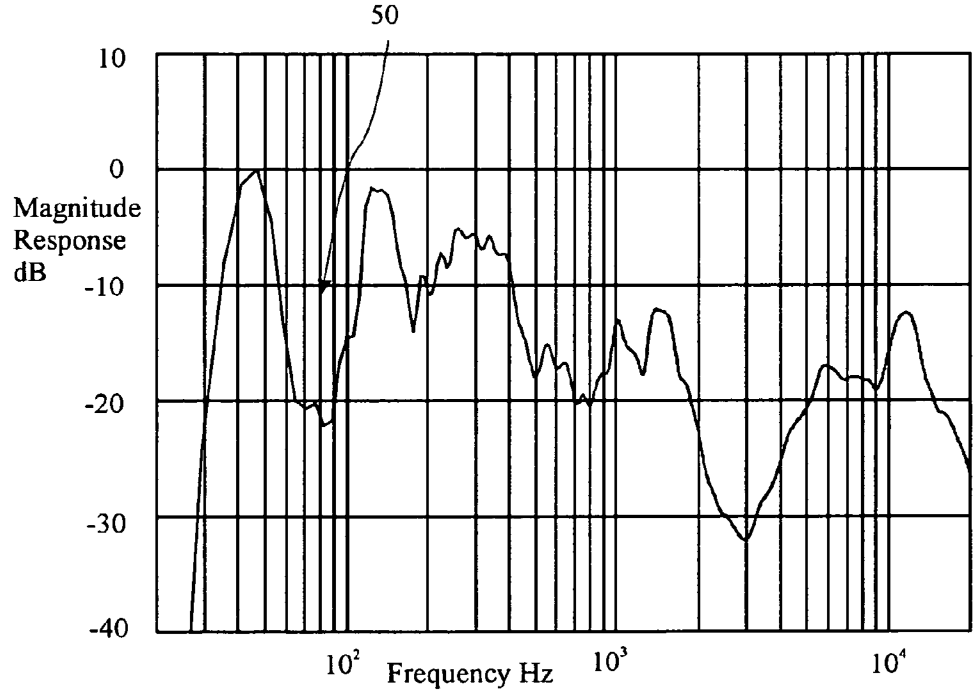
FIG. 7D is a combined satellite speaker and subwoofer magnitude response for a cross-over frequency of 60 Hz.
Figure 7E:
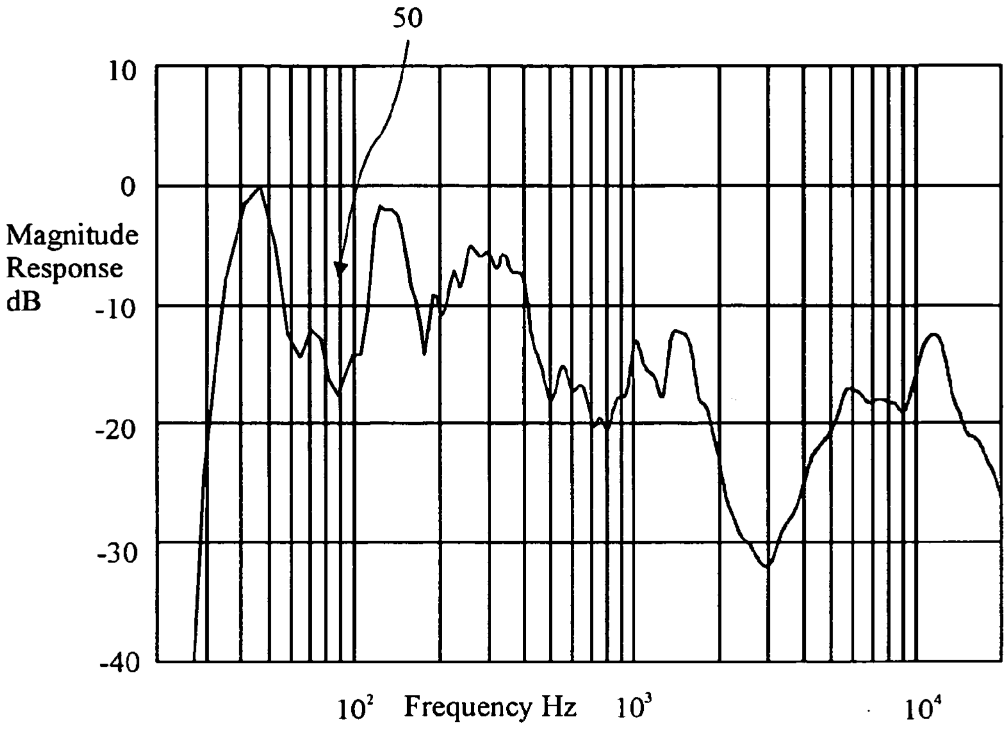
FIG. 7E is a combined satellite speaker and subwoofer magnitude response for a cross-over frequency of 70 Hz.
Figure 7F:
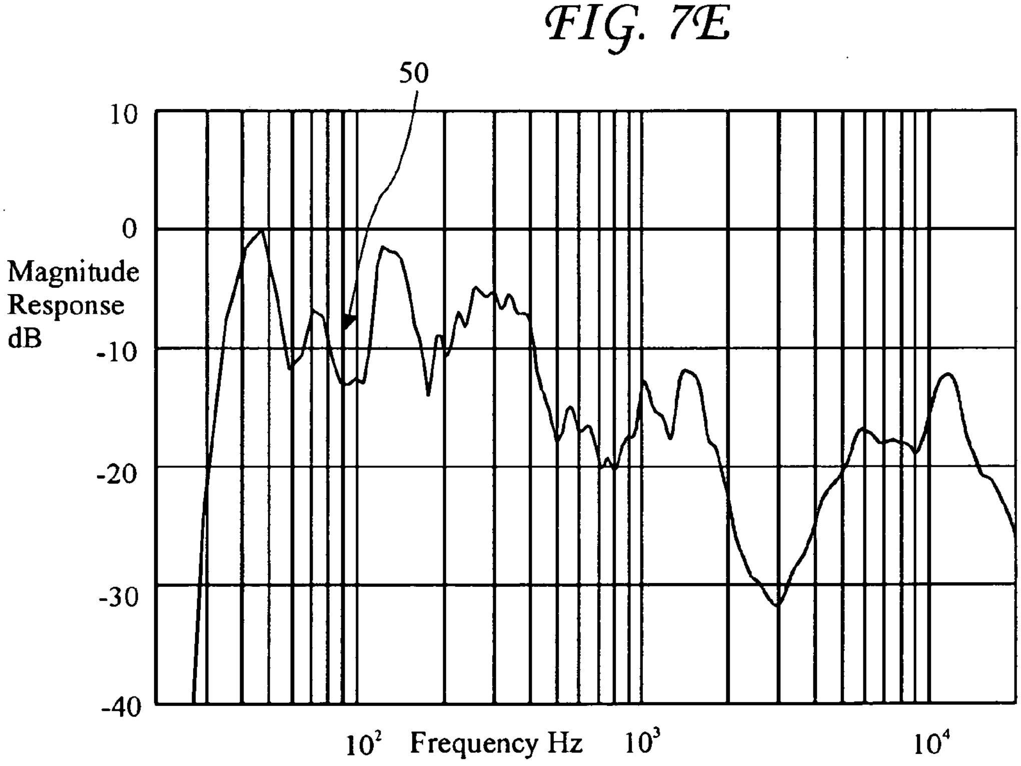
FIG. 7F is a combined satellite speaker and subwoofer magnitude response for a cross-over frequency of 80 Hz.
Figure 7G:
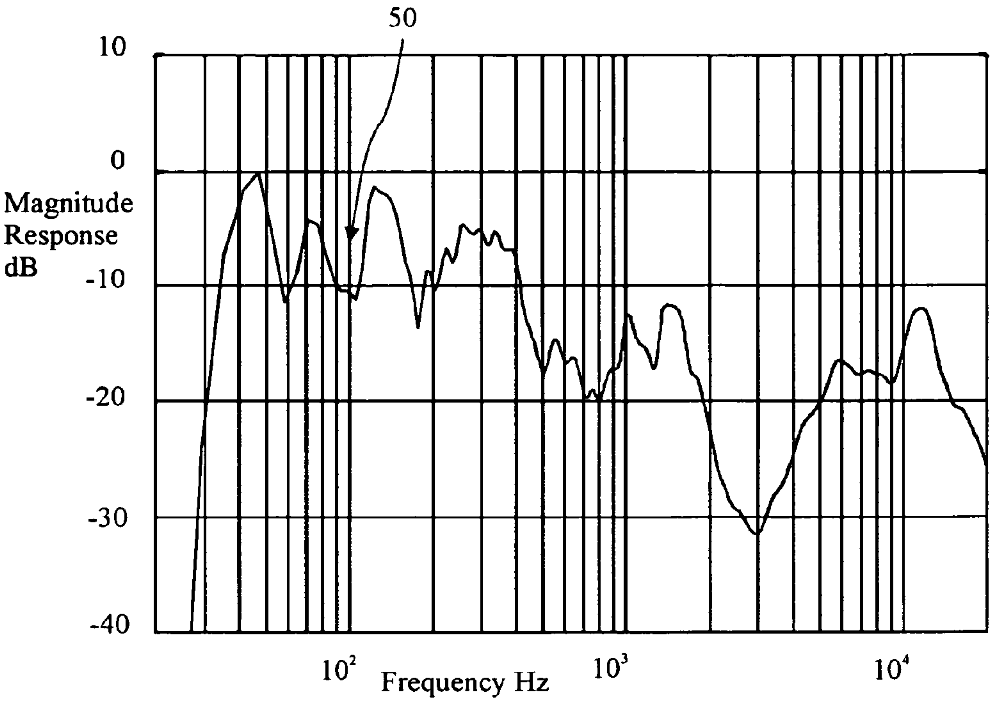
FIG. 7G is a combined satellite speaker and subwoofer magnitude response for a cross-over frequency of 90 Hz.
Figure 7H:
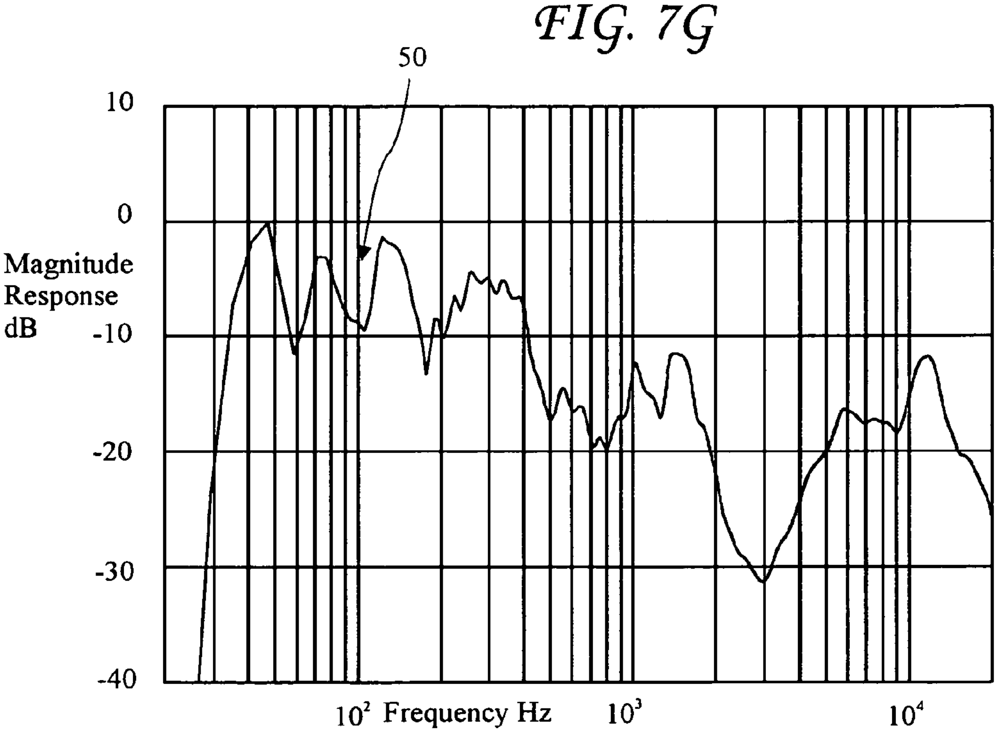
FIG. 7H is a combined satellite speaker and subwoofer magnitude response for a cross-over frequency of 100 Hz.

Further, known signal processors 12 may include equalization filters **52*a*-52*e*, and 54, as shown in FIG. 6. Although the equalization filters 52*a*-52*e*, and 54 provides some ability to tune the sound reproduction for a particular room environment and/or listener preference, the equalization filters 52*a*-52*e*, and 54 do not generally remove the spectral notch 50, nor do they minimize the variations in the response in the cross-over region. In general, the equalization filters 52*a*-52*e*, and 54** are minimum phase and as such often do little to influence the frequency response around the cross-over.

The present invention provides a system and method for minimizing the spectral notching 50 and/or response variations in the crossover region. While the embodiment of the present invention described herein does not describe the application of the present invention to systems including equalization filters for each channel, the method of the present invention is easily extended to such systems.

Known signal processors 12 (see FIG. 1) include a capability to select one of a set of cross-over frequencies. For example, the Denon® AVR—5805 receiver has selectable cross-over frequencies in 10 Hz increments from 20 Hz through 200 Hz, and at 250 Hz (i.e., 20 Hz, 30 Hz, 40 Hz, . . . 200 Hz, 250 Hz). An optimal cross-over frequency might be found through a gradient descent optimization, with respect to the 3 dB frequency of the bass-management filter (for example, a Butterworth filter), and a corresponding objective function could be the error between the resulting magnitude response and a zero dB or flat response, around the cross-over region. However, such gradient descent optimization is unnecessarily complicated. Because the choice of cross-over frequency is generally limited to a finite set of frequencies, a simple and effective method to select an optimal cross-over frequency is to characterize the effect of the choice of each available cross-over frequency based on the net subwoofer-satellite speaker magnitude response in the cross-over region.

The home theater 10 generally resides in a room comprising an acoustic enclosure which can be modeled as a linear system whose behavior at a particular listening position is characterized by a time domain impulse function, h(n); n {0, 1, 2, . . . }. The time domain impulse response h(n) is generally called the room impulse response which has an associated frequency response, $H(e^{j\omega})$ which is a function of frequency (for example, between 20 Hz and 20,000 Hz). $H(e^{j\omega})$ is generally referred to the Room Transfer Function (RTF). The time domain response h(n) and the frequency domain response RTF are linearly related through the Fourier transform, that is, given one we can find the other via the Fourier relations, wherein the Fourier transform of the time domain response yields the RTF. The RTF provides a complete description of the changes the acoustic signal undergoes when it travels from a source to a receiver (microphone/listener). The RTF may be measured by transmitting an appropriate signal, for example, a logarithmic chirp signal, from a speaker, and deconvolving a response at a listener position. The signal at a listening position 24 consists of direct path components, discrete reflections which arrive a few milliseconds after the direct path components, as well as reverberant field components.

An objective function which is particularly useful for characterizing the magnitude response is the spectral deviation measure $\sigma_E$. The spectral deviation measure $\sigma_E$ is a measure of the variation of the spectral response at discrete frequencies in the cross-over region, from an average spectral response Δ taken over the entire cross-over region. When the effects of the choice of the cross-over frequency are bandlimited around the cross-over region, the spectral deviation measure $\sigma_E$ is quite effective at predicting the behavior of the resulting magnitude response around the cross-over region. The spectral deviation measure $\sigma_E$ may be defined as:

$$\sigma_E = \sqrt{\left[\frac{1}{P}\Sigma_{i=0}^{P-1}\left(10\log_{10}|E(e^{j\omega_i})|-\Delta\right)^2\right]}$$

where the average spectral deviation Δ is:

$$\Delta = \frac{1}{P}\sum_{i=0}^{P-1}\left(10\log_{10}|E(e^{j\omega_i})|\right)$$

and the net subwoofer and satellite speaker response $E(e^{j\omega})$ is, $$E(e^{j\omega})=H_{sub}(e^{j\omega})+H_{sat}(e^{j\omega})$$

and P is the number of discrete selectable cross-over frequencies. Alternatively, other objective functions employing a standard deviation rule (with or without frequency weighting) may be employed. An example of a typical cross-over region is between L Hz and M Hz (e.g., L=30 and M=200), and an example of a set of discrete selectable cross-over frequencies comprises frequencies between 30 Hz and 200 Hz in N Hz steps (e.g., N=10).

The Room Transfer Function $H(e^{j\omega})$ may be obtained using any of several well known methods. A preferred method is the application of a pseudo-random sequence to the speaker, and deconvolving the response at the listener position 24. One such method comprises cross-correlating a measured signal with a pseudo-random sequence. A particularly useful pseudo-random signal is a binary Maximum Length Sequence (MLS).

Another method for computing the Room Transfer Function $H(e^{j\omega})$ comprises a circular deconvolution wherein the measured signal is Fourier transformed, divided by the Fourier transform of the input signal, and the result is inverse Fourier transformed. A preferred signal for this method is a logarithmic sweep.

The magnitude responses for an exemplar speaker system for cross-over frequencies of 30 Hz, 40 Hz, 50 Hz, 60 Hz, 70 Hz, 80 Hz, 90 Hz, and 100 Hz are shown in FIGS. 7A-7H. The spectral notch 50 can be seen to translate somewhat to the right, and significantly decreases in FIGS. 7F-7H. The spectral deviation measures $\sigma_E$ computed for each cross-over frequencies are:

| Cross-over Frequency | $\sigma_E$ |
|---|---|
| 30 | 1.90 |
| 40 | 2.04 |
| 50 | 2.19 |
| 60 | 2.05 |
| 70 | 1.53 |
| 80 | 1.17 |
| 90 | 0.96 |
| 100 | 0.83 |

Comparing the FIGS. 7A-7H, the spectral deviation measure $\sigma_E$ shows a marked decease for cross-over frequencies of 80 Hz, 90 Hz, and 100 Hz.

Figure 8:
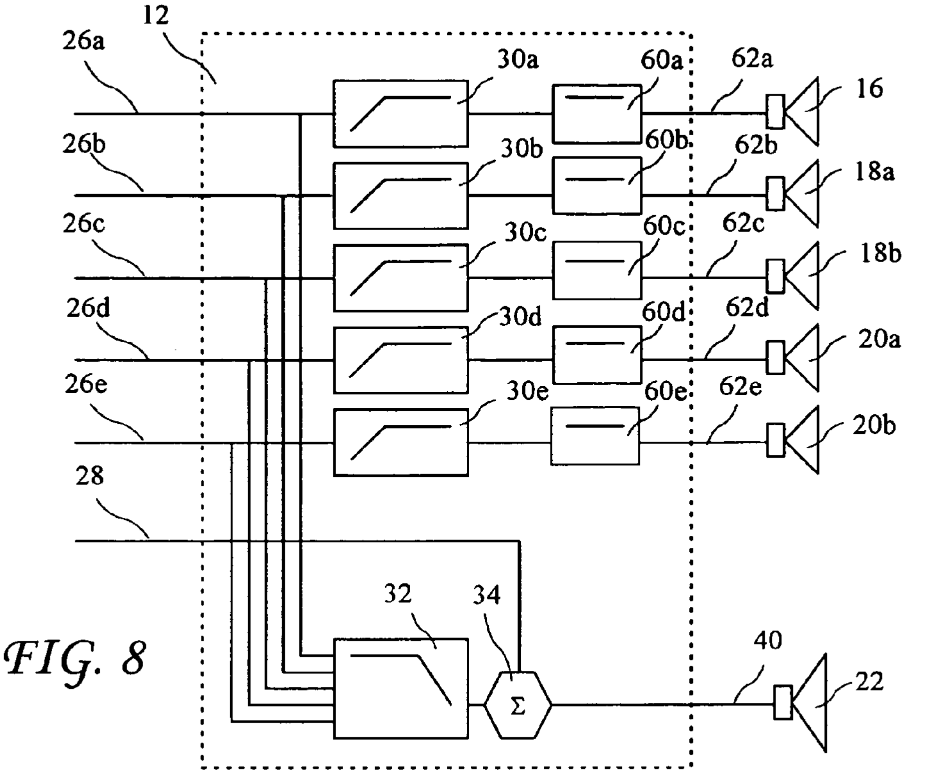
FIG. 8 is a signal processor flow according to the present invention including all-pass filters.
Figure 9:
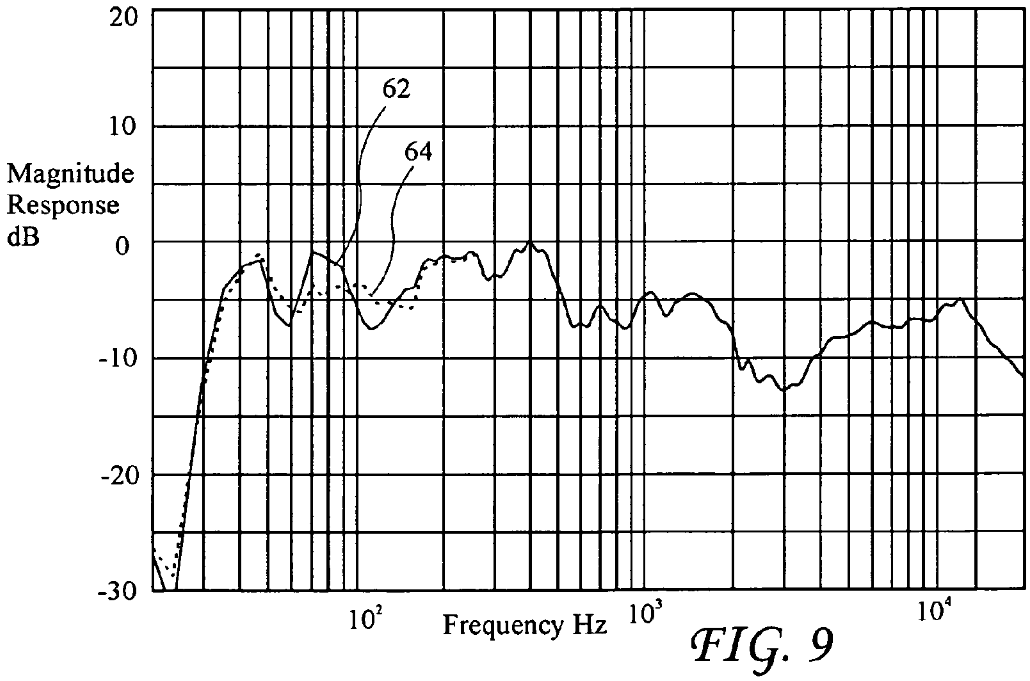
FIG. 9 shows a speaker suite magnitude response without all-pass filtering and with all-pass filtering.

Thus, the cross-over frequency selection described above provides measurable attenuation of the spectral notch and/or minimization of the spectral deviations in the crossover region. In some cases, where further attenuation of the spectral notch is desired, all-pass filters 60*a*-60*e* may be included in the signal processor 12, as shown in FIG. 8. All-pass filters 60*a*-60*e* have unit magnitude response across the frequency spectrum, while introducing frequency dependent group delays (e.g., frequency shifts). The all-pass filters 60*a*-60*e* are preferably cascaded with the high pass filters 30*a*-30*e* and are preferably M-cascade all-pass filters $A_M(e^j)$ where each section in the cascade comprises a second order all-pass filter.

The second stage of attenuation of the spectral notch is achieved by adaptively minimizing a phase term:

$$\phi_{sub}(\omega)-\phi_{speaker}(\omega)-\phi_{A_M}(\omega)$$

where:

$\phi_{sub}(\omega)$=the phase spectrum for the subwoofer;

$\phi_{speaker}(\omega)$=the phase spectrum for the satellite speaker 16, 18*a*, 18*b*, 20*a*, or 20*b*; and $\phi_{A_M}(\omega)$=the phase spectrum of the all-pass filter.

The M cascade all-pass filter $A_M$ may be expressed as:

$$A_M(e^{j\omega}) = \Pi_{k=1}^{M} \frac{e^{-j\omega} - r_k e^{j\theta_k}}{1 - r_k e^{j\theta_k} e^{-j\omega}} \cdot \frac{e^{-j\omega} - r_k e^{j\theta_k}}{1 - r_k e^{-j\theta_k} e^{-j\omega}}$$

and the resulting frequency dependent phase shift is:

$$\phi_{A_M}(\omega) = \sum_{k=1}^{M} \phi_{A_M}^{(k)}(\omega) \text{ and,}$$

$$\phi_{A_M}^{(i)} = -2\omega - 2\tan^{-1}\left(\frac{r_i \sin(\omega - \theta_i)}{1 - r_i \cos(\omega - \theta_i)}\right) - 2\tan^{-1}\left(\frac{r_i \sin(\omega + \theta_i)}{1 - r_i \cos(\omega + \theta_i)}\right)$$

A second objective function, J(n) is:

$$J(n) = \frac{1}{N} \sum_{i=1}^{N} W(\omega_i)(\phi_{sub}(\omega) - \phi_{speaker}(\omega) - \phi_{A_M}(\omega))^2$$

The terms $r_i$ and $\theta_i$ may be determined using an adaptive recursive formula by minimizing the objective function J(n) with respect to $r_i$ and $\theta_i$. The update equations are:

$$r_i(n+1) = r_i(n) - \frac{\mu_r}{2} \nabla_{r_i} J(n); \text{ and}$$

$$\theta_i(n+1) = \theta_i(n) - \frac{\mu_\theta}{2} \nabla_{\theta_i} J(n)$$

where $\mu_r$ and $\mu_\theta$ are adaptation rate control parameters chosen to guarantee stable convergence and are typically between zero and one. Finally, the gradients of the objective function J(n) with respect to the parameters of the all-pass function is are:

$$\nabla_{r_i} J(n) = \sum_{l=1}^{N} W(\omega_l) E(\phi(\omega))(-1) \frac{\delta\phi_{A_M}(\omega)}{\delta r_i(n)}$$

and, $$\nabla_{\theta_i} J(n) = \sum_{l=1}^{N} W(\omega_l) E(\phi(\omega))(-1) \frac{\delta\phi_{A_M}(\omega)}{\delta\theta_i(n)}$$

where:

$$E(\phi(\omega)) = \phi_{subwoofer}(\omega) - \phi_{speaker}(\omega) - \phi_{A_M}(\omega)$$

and, $$\frac{\delta\phi_{A_M}(\omega)}{\delta\theta_i(n)} = \frac{2r_i(n)(r_i(n) - \cos(\omega_l - \theta_i(n)))}{r_i^2(n) - 2r_i(n)\cos(\omega_l - \theta_i(n)) + 1} - \frac{2r_i(n)(r_i(n) - \cos(\omega_l + \theta_i(n)))}{r_i^2(n) - 2r_i(n)\cos(\omega_l + \theta_i(n)) + 1}$$

and, $$\frac{\delta\phi_{A_M}(\omega)}{\delta r_i(n)} = \frac{2\sin(\omega_l - \theta_i(n))}{r_i^2(n) - 2r_i(n)\cos(\omega_l - \theta_i(n)) + 1} -$$

-continued $$\frac{2\sin(\omega_l + \theta_i(n))}{r_i^2(n) - 2r_i(n)\cos(\omega_l + \theta_i(n)) + 1}$$

In order to guarantee stability, the magnitude of the pole radius $r_i(n)$ is preferably kept less than one. A preferable method for keeping the magnitude of the pole radius $r_i(n)$ less than one is to randomize $r_i(n)$ between zero and one whenever $r_i(n)$ is greater than or equal to one.

Figure 10A:
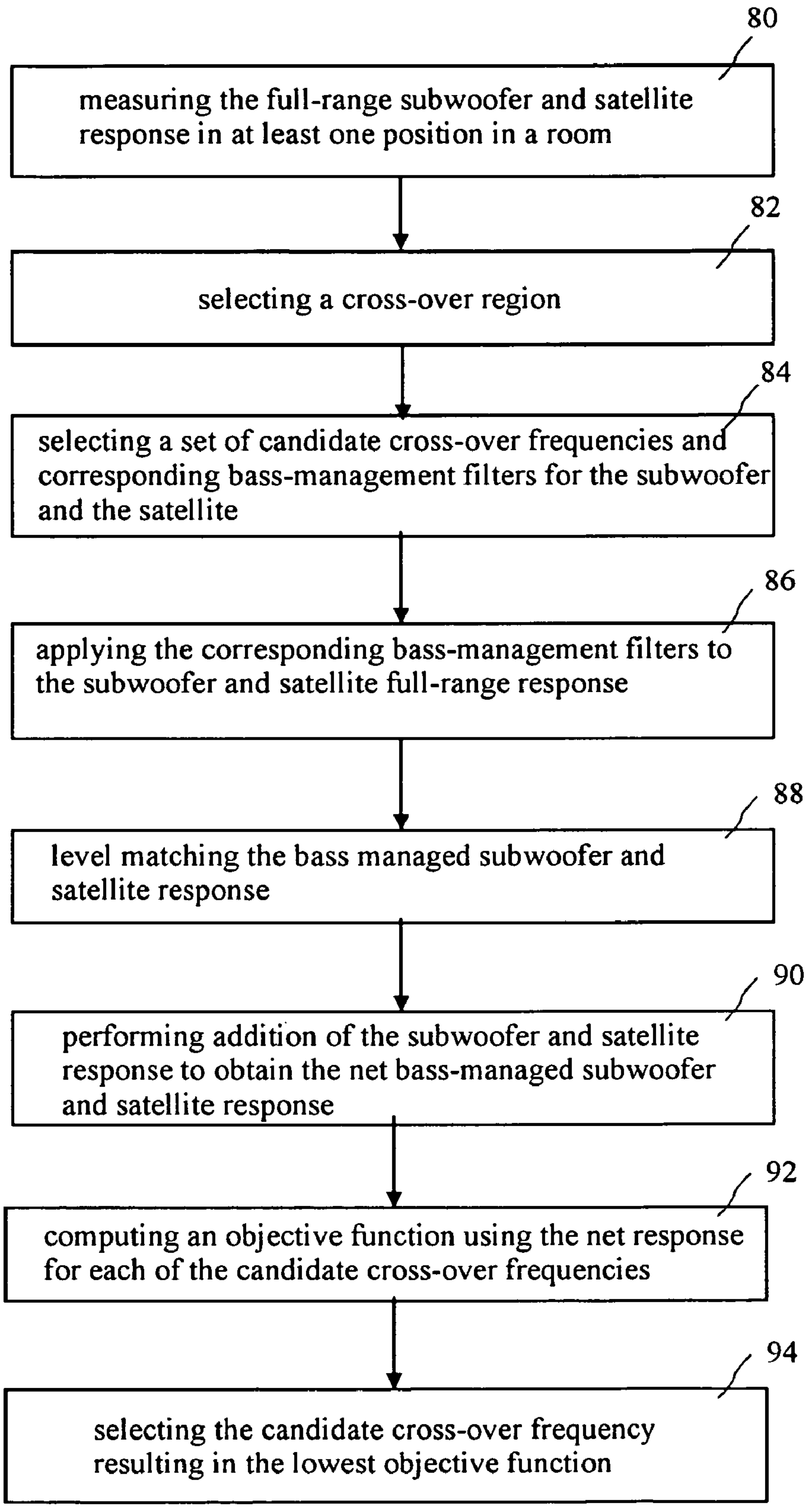
FIG. 10A is a first method according to the present invention.

A first a method according to the present invention is described in FIG. 10A, and a second method according to the present invention is described in FIG. 11B. The second method is preferably performed following the first method. The first method includes the steps of measuring the full-range (i.e., non bass-managed) subwoofer and satellite speaker response in at least one position in a room at step 80, selecting a cross-over region at step 82, selecting a set of candidate cross-over frequencies and corresponding bass-management filters for the subwoofer and the satellite speaker at step 84, applying the corresponding bass-management filters to the subwoofer and satellite speaker full-range response at step 86, level matching the bass managed subwoofer and satellite speaker response at step 88, performing addition of the subwoofer and satellite speaker response to obtain the net bass-managed subwoofer and satellite speaker response at step 90, computing an objective function using the net response for each of the candidate cross-over frequencies at step 92, and selecting the candidate cross-over frequency resulting in the lowest objective function at step 94.

Computing the objective function may comprise computing the spectral deviation measure $\sigma_E$, or computing a standard deviation with or without frequency weighting. Level matching is comparing the speaker response without bass-management to the speaker response with bass-management, and is preferably comparing the root-mean-square (RMS) level of the satellite speaker response, without bass-management, using C-weighting and test noise (e.g., THX test noise) to the (RMS) level of the satellite speaker response, with bass-management, using C-weighting and test noise.

The first method may further address the selection of a cross-over frequency for multiple listener locations by computing a multiplicity of objective functions (preferably computing a multiplicity of spectral deviation measures $\sigma_E$) for a multiplicity of candidate cross-over frequencies at the multiplicity of different listen locations, averaging the multiplicity of objective functions over the multiplicity of different listen locations to obtain an average objective function for each of the multiplicity of candidate cross-over frequencies, and selecting the candidate cross-over frequencies which provides the lowest average objective function.

Figure 10B:
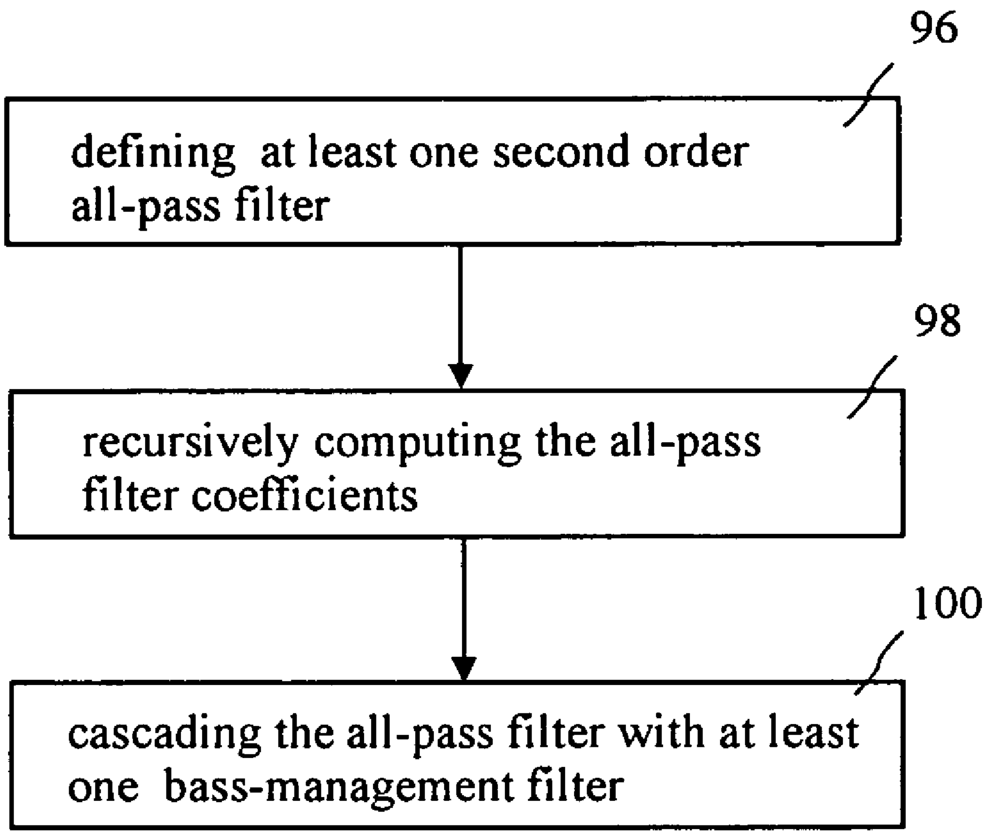
FIG. 10B is a second method according to the present invention.

A second method according to the present invention is described in FIG. 10B. The second method may be exercised following the first method to further attenuate the spectral notch. The second method comprises defining at least one second order all-pass filter having all-pass filter coefficients selectable to reduce incoherent addition of acoustic signals produced by the subwoofer and the satellite speaker at step 96, recursively computing the all-pass filter coefficients to minimize a phase response error at step 98, the phase response error being a function of phase responses of a subwoofer-room response, a satellite-room response, and the subwoofer and satellite bass-management filter responses, and cascading the all-pass filter with at least one of the satellite speaker bass-management filter and subwoofer bass-management filter at step 100

While the invention herein disclosed has been described by means of specific embodiments and applications thereof, numerous modifications and variations could be made thereto by those skilled in the art without departing from the scope of the invention set forth in the claims.

We claim:

1. A method for selecting a cross-over frequency to attenuate a spectral notch in a cross-over region, the method comprising:

measuring a full-range subwoofer and satellite speaker response in at least one position in a room;

selecting a cross-over region;

selecting a set of candidate cross-over frequencies and corresponding bass-management filters for the subwoofer and the satellite speaker;

applying corresponding bass-management filters to the full-range subwoofer and satellite speaker response to obtain bass managed subwoofer and satellite speaker responses;

level matching the bass managed subwoofer and satellite speaker responses to obtain leveled subwoofer and satellite speaker responses;

summing the leveled subwoofer and satellite speaker responses to obtain a net bass-managed subwoofer and satellite speaker response;

computing an objective function measure using the net bass-managed subwoofer and satellite speaker response for each of the candidate cross-over frequencies; and selecting the candidate cross-over frequency resulting in the lowest objective function measure.

2. The method of claim 1, wherein computing an objective function measure comprises computing a spectral deviation measure $\sigma_E$.

3. The method of claim 2, wherein computing an objective function measure comprises computing a measure of the variation of the spectral response at discrete frequencies in the cross-over region, from an average spectral response $\Delta$ taken over the entire cross-over region.

4. The method of claim 1, wherein computing an objective function measure comprises computing a standard deviation based measure.

5. The method of claim 4, wherein computing an objective function measure comprises computing a frequency weighted standard deviation based measure.

6. The method of claim 1, wherein measuring a full-range subwoofer and satellite speaker response comprises measuring a Room Transfer Function (RTF).

7. The method of claim 6, wherein measuring the RTF comprises transmitting a logarithmic chirp signal to a speaker, and deconvolving a response at a listener position, wherein the Fourier transform of the response yields the RTF.

8. The method of claim 6, wherein measuring the RTF comprises a transmitting a pseudo-random sequence a speaker, and deconvolving the response at a listener position.

9. The method of claim 1, further including performing all-pass filtering following high pass filtering to reduce incoherent addition of acoustic signals from at least one satellite speaker and a subwoofer.

10. The method of claim 9, wherein applying all-pass filtering comprises applying all-pass filtering derived by adaptively minimizing a phase term.

11. The method of claim 1, further including the step of performing 1/N octave smoothing of the net bass-managed response.

12. The method of claim 11, wherein performing 1/N octave smoothing of the net bass-managed response comprises performing ⅓ octave smoothing of the net bass-managed response.

13. The method of claim 1, wherein computing the objective function measure comprises computing a multiplicity of objective function measures for a multiplicity of candidate cross-over frequencies at the multiplicity of different listen locations, and further including the step of averaging the multiplicity of objective function measures over the multiplicity of different listen locations to obtain an average objective function measure for each of the multiplicity of candidate cross-over frequencies, and wherein selecting the candidate cross-over frequency resulting in the lowest objective function measure comprises selecting the candidate cross-over frequencies which provides the lowest average objective function measure.

14. The method of claim 13, wherein computing a multiplicity of objective function measures comprises computing a computing a multiplicity of spectral deviation measures $\sigma_E$.

15. A method for attenuating an incoherent addition of satellite speaker and subwoofer acoustic signals, the method comprising:

measuring the full-range subwoofer and satellite speaker response in at least one position in a room;

selecting a cross-over region;

selecting a set of candidate cross-over frequencies and corresponding bass-management filters for the subwoofer and the satellite speakers;

applying the corresponding bass-management filters to the subwoofer and satellite speaker full-range response;

level matching the bass managed subwoofer and satellite speaker response;

summing the subwoofer and satellite speaker response to obtain a net bass-managed subwoofer and satellite speaker response;

computing an objective function measure using the net bass-managed subwoofer and satellite speaker response for each of the candidate cross-over frequencies;

selecting the candidate cross-over frequency resulting in the lowest objective function measure;

filtering speaker signals using the selected cross-over frequency and corresponding bass-management filters; and performing all-pass filtering on the filtered speaker signals to further attenuate spectral notches.

16. The method of claim 15, wherein performing all-pass filtering on the filtered speaker signals to further attenuate spectral notches comprises performing all-pass filtering on the filtered speaker signals provided to the satellite speakers.

17. A method for selecting a cross-over frequency to attenuate a spectral notch in a cross-over region, the method comprising:

measuring a full-range subwoofer and satellite speaker response in at least one position in a room;

selecting a cross-over region;

selecting a set of candidate cross-over frequencies and corresponding bass-management filters for the subwoofer and the satellite speaker;

applying corresponding bass-management filters to the full-range subwoofer and satellite speaker response to obtain bass managed subwoofer and satellite speaker responses;

level matching the bass managed subwoofer and satellite speaker responses to obtain leveled subwoofer and satellite speaker responses;

summing the leveled subwoofer and satellite speaker responses to obtain a net bass-managed subwoofer and satellite speaker response;

computing an objective function measure using the net bass-managed subwoofer and satellite speaker response for each of the candidate cross-over frequencies;

selecting the candidate cross-over frequency resulting in the lowest objective function measure;

following selecting the cross-over frequency, further attenuating variations in the cross-over region by:

defining at least one second order all-pass filter having all-pass filter coefficients selectable to reduce incoherent addition of acoustic signals produced by the subwoofer and the satellite speaker;

recursively computing the all-pass filter coefficients to minimize a phase response error, the phase response error being a function of phase responses of a subwoofer-room response, a satellite-room response, and the subwoofer and satellite bass-management filter responses; and cascading the all-pass filter with at least one of the satellite speaker bass-management filter and subwoofer bass-management filter.

18. The method of claim 17, wherein processing a speaker channel with the all-pass filter comprises applying at the least one second order all-pass filter in a satellite channel level matching.

19. The method of claim 17, wherein cascading the all-pass filter comprises cascading the all-pass filter with the satellite speaker bass-management filter.

20. The method of claim 18, wherein cascading the all-pass filter comprises cascading a plurality of all-pass filters with a plurality of satellite speaker bass-management filter.

* * * * *